United States Patent [19]

Schade, Jr.

[11] 4,334,196
[45] Jun. 8, 1982

[54] AMPLIFIER USING LATERAL AND VERTICAL TRANSISTORS

[75] Inventor: Otto H. Schade, Jr., North Caldwell, N.J.

[73] Assignee: RCA Corporation, New York, N.Y.

[21] Appl. No.: 131,518

[22] Filed: Mar. 18, 1980

[51] Int. Cl.³ .............................................. H03F 3/45
[52] U.S. Cl. .................. 330/253; 330/257; 307/303
[58] Field of Search ............... 307/303, 459; 357/40, 357/92; 330/253, 257, 307, 288

[56] References Cited

U.S. PATENT DOCUMENTS 3,852,679 12/1974 Schade ............................. 330/257
4,142,115 2/1979 Nakata ............................. 307/303

OTHER PUBLICATIONS

*Electronics*, Apr. 27, 1978, p. 134.

"Driver ICs Use New Semi Process", *EDN*, Sep. 20, 1979, pp. 54-55.

*Primary Examiner*—Michael J. Tokar
*Attorney, Agent, or Firm*—Eugene M. Whitacre; Paul J. Rasmussen; Allan J. Jacobson

[57] ABSTRACT

In addition to the usual field-effect transistor structures available in CMOS-type integrated circuitry, certain bipolar transistor structures are also available for use in linear amplifier circuits combining both bipolar and FET devices. One of the transistor structures available, i.e., a vertical transistor, has high current gain but its collector region, integral to the substrate, is committed to substrate potential. The other of the bipolar transistor structures available, i.e., a lateral transistor, has an uncommitted collector, but has low current gain. A cascade connection of both bipolar transistor types provides a composite transistor with high current gain and uncommitted collector useful in combination with field-effect transistor structures to form novel amplifier arrangements.

11 Claims, 5 Drawing Figures

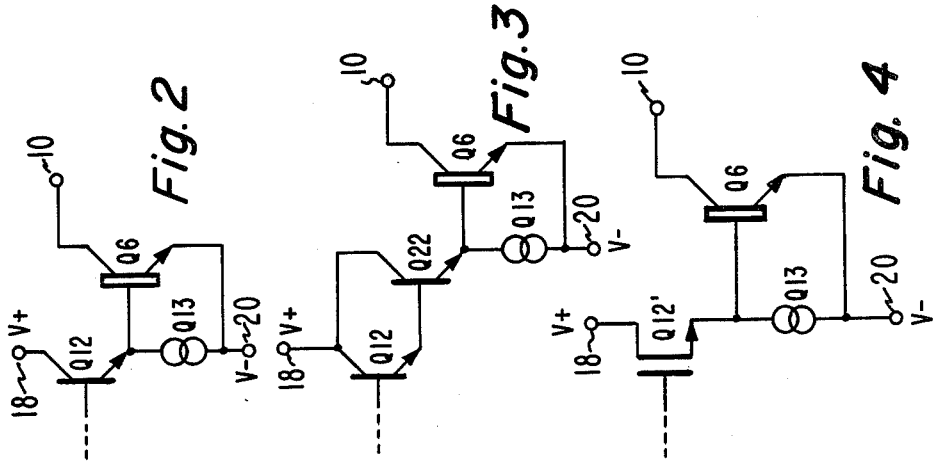
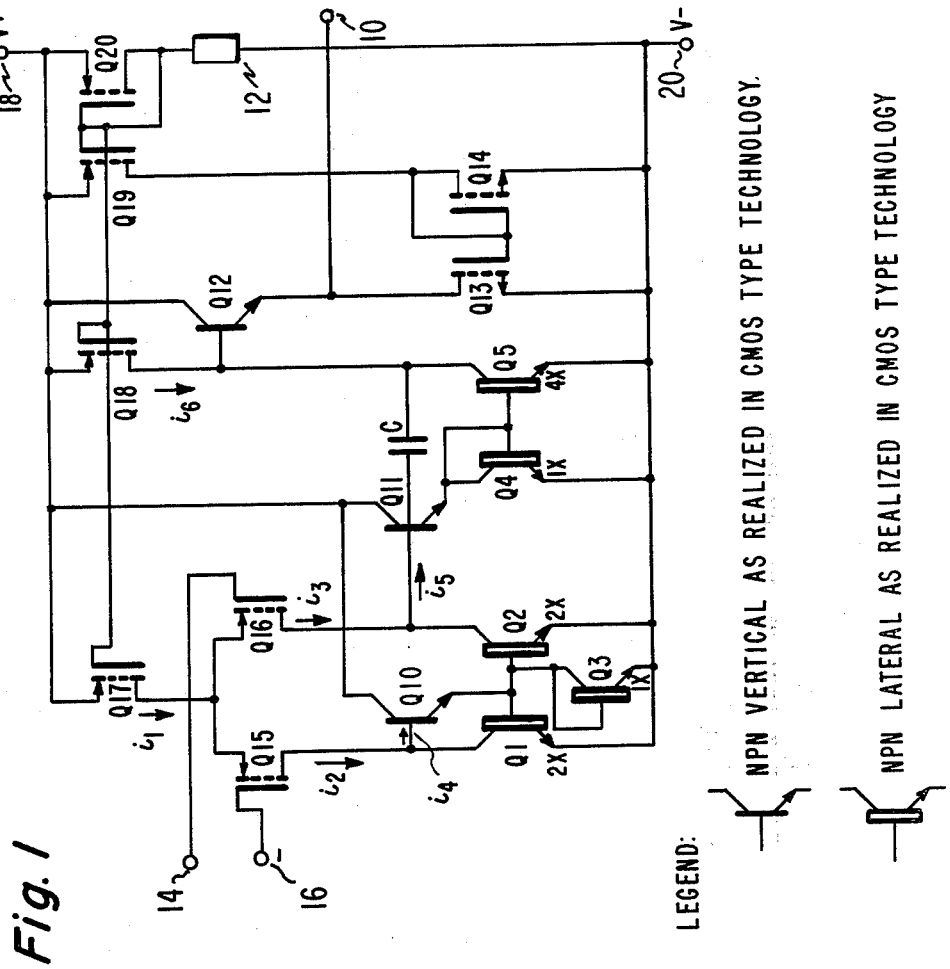

AMPLIFIER USING LATERAL AND VERTICAL TRANSISTORS

BACKGROUND OF THE INVENTION

This invention pertains to amplifier circuits suitable for fabrication in CMOS-type technology, and wherein such amplifiers use both bipolar and field-effect transistors.

It is desirable to combine complementary symmetry metal-oxide-semiconductor (CMOS) and bipolar technology using the relatively simple CMOS process to fabricate both MOS transistors an bipolar transistors on the same semiconductor substrate. Such combination offers several important advantages.

One advantage in combining CMOS and bipolar technology is the ability to use both MOS transistors and bipolar transistors together in a linear amplifier to obtain the benefits of the best characteristics of each type of transistor. For example, MOS transistors can provide exceptionally high input impedance, while bipolar transistors can provide much higher current capability than MOS transistors for a given substrate area. Therefore, by using a matched pair of MOS transistors arranged as a differential amplifier input means to provide improved input characteristics, and by using bipolar transistors arranged in current mirror amplifier configurations to provide high performance linear signal gain, the performance level of an operational amplifier circuit using both types of transistors can be improved beyond that available by using MOS or bipolar transistors alone.

Another advantage of combining CMOS and bipolar technology is that digital functions may be advantageously combined with linear functions on the same substrate. For example, the operational amplifier portion of an analog-to-digital converter may be constructed using MOS and bipolar transistors, while the digital control section thereof may be constructed using CMOS transistors as logic elements. Such mixed linear and digital capability leads to still higher levels of integration and more flexible system partitioning between large scale integrated chips.

There are other mixed-technology integrated circuits using FET and bipolar transistors. One such type is a combination of bipolar and junction FET (BiFET). Another type is bipolar and MOS (BiMOS). But BiFET has no suitable logic family, and BiMOS has poor linear packing density. The combination of CMOS and bipolar technology, however, provides both a suitable logic family and improved packing density. Digital logic is provided by conventional CMOS logic circuits. Furthermore, linear packing density is improved by using conventional CMOS guard band techniques to isolate various transistors from each other, to avoid having to devote substantial areas of the chip for the isolation function, as is required in BiMOS technology. Finally, the CMOS fabrication process is generally less complex than either the BiFET or BiMOS processes.

SUMMARY OF THE INVENTION

In accordance with the present invention, linear amplifier circuits comprising bipolar and MOS transistors are fabricated using transistor structures available in a CMOS-type structure. One type of bipolar structure available is a vertical transistor having high gain, but a collector region integral to the substrate and committed to the substrate potential. Another type of bipolar structure available is a lateral transistor having low gain, but an uncommitted collector. A primary aspect of the present invention is the cascading of vertical and lateral transistors to form a composite transistor with high current gain and uncommitted collector. The lateral/vertical composite transistor is then combined with other MOS transistors to form novel amplifier arrangements in further aspects of the invention.

BRIEF DESCRIPTION OF THE DRAWINGS

FIG. 1 is a schematic diagram of an amplifier using lateral and vertical transistors.

FIGS. 2, 3, and 4 are each schematic diagrams illustrating alternate output stages for the amplifier of FIG. 1.

DESCRIPTION OF A PREFERRED EMBODIMENT OF THE INVENTION

Figure 5:
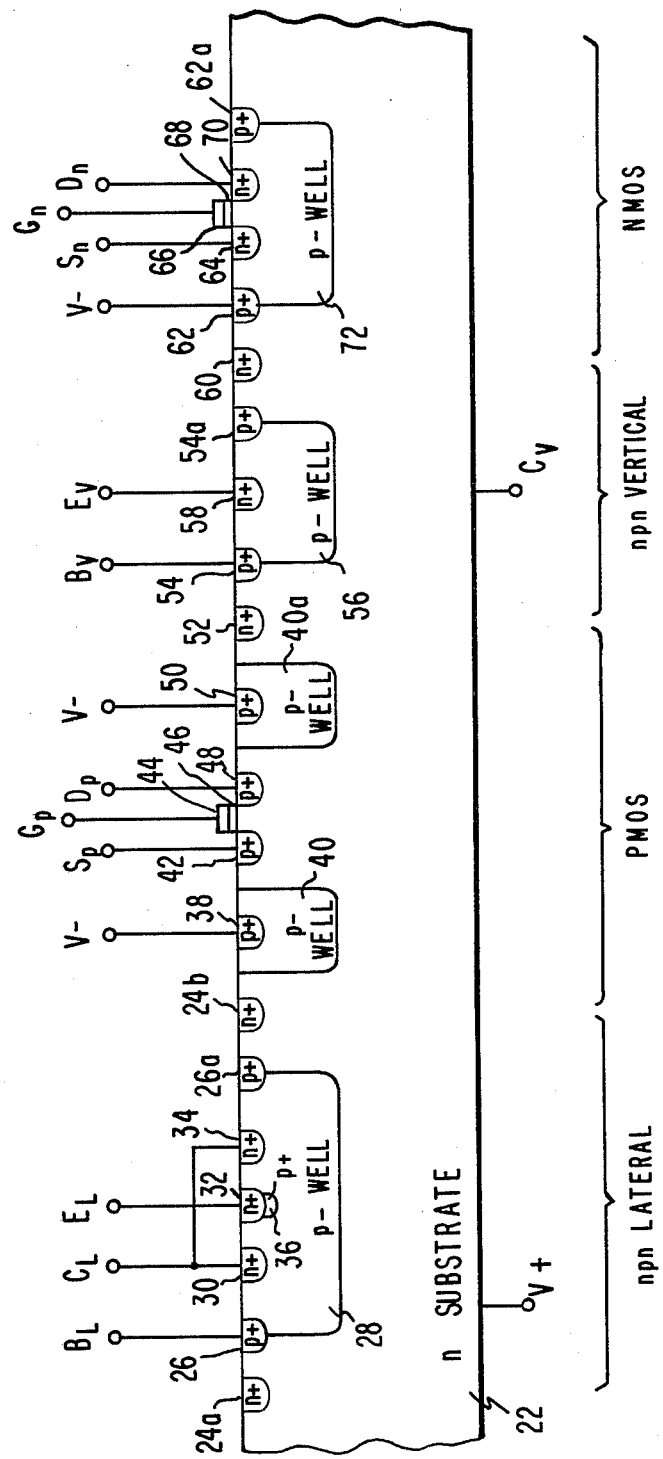
FIG. 5 is a cross-sectional view illustrating various transistor structures available on an integrated circuit substrate embodying the present invention.

A basic amplifier circuit embodying the present invention is shown in FIG. 1. Transistors Q13 and Q14 are each N-channel MOS devices, while transistors Q15 through Q20 are each P-channel MOS devices. Transistors Q1 through Q5, and Q10 through Q12 are each NPN bipolar transistors. Terminals 18 and 20 are arranged for receiving an operating potential therebetween. For the polarity of transistors shown, the V+ potential applied to terminal 18 is positive relative to the V− potential applied at terminal 20.

FIG. 1 further includes a legend defining different symbols for two types of NPN bipolar transistors used in the FIGURE. In particular, transistors Q1 through Q5 are each bipolar NPN transistors are realized in a lateral structure; transistors Q10 through Q12 are each bipolar NPN transistors as realized in a vertical structure.

As will become clear from a description hereinafter, concerning FIGURES of the drawing, vertical and lateral transistors available in CMOS have different characteristics owing to their respective different structures. For example, the common emitter forward current gain, or beta, of a vertical transistor, $\beta_V$, is relatively higher than that of a lateral transistor. A lateral transistor can have a beta, $\beta_L$, typically between 30 and 50. A vertical transistor, on the other hand, has a beta in the range of 100 to 400, with a typical value of about 200. However, the higher gain vertical transistors are limited in their connection flexibility because the substrate of the integrated circuit also serves as the collector region thereof. Hence, vertical transistors Q10, Q11, and Q12 in FIG. 1 all have their collector electrode connected to terminal 18 via a common connection to the substrate. In comparison, lateral transistors (Q1–Q5) all have uncommitted collector, emitter and base electrodes.

Vertical and lateral transistors are used in various combinations resulting in a composite transistor structure having both high gain and connection flexibility. A basic circuit configuration using lateral and vertical transistors, shown in FIG. 2 for example, is a lateral transistor Q6 having the emitter electrode thereof connected to a point of more negative potential, such as terminal 20, and a vertical transistor Q12 having a connection from the emitter electrode thereof to the base electrode of the lateral transistor. The resulting composite transistor includes an emitter follower (comprising the vertical transistor) followed in cascade by a common emitter amplifier (comprising the lateral transistor). The input or "base" connection of such composite transistor is the base electrode of the vertical transistor; the output or "collector" conection of such composite transistor is the collector electrode of the lateral transistor; and the node to which the emitter of the lateral transistor connects is the common or "emitter" connection of the composite transistor. The beta of the resulting composite transistor is $(\beta_V+1)\beta_L$. Since $\beta_V$ is much larger than 1, the beta of the composite transistor is essentially equal to the product of the respective betas of the lateral and vertical transistors. Note that the composite transistor has both a high gain and an uncommitted collector output.

A high impedance input stage may be added to the composite transistor, thus described, by combining an MOS transistor having its principal current conduction channel connected between the base electrode of the vertical transistor and a point of relatively positive potential, such as terminal 18. The input to such MOS/bipolar combination is then the gate electrode of the MOS transistor.

An embodiment of vertical and lateral transistors for use in the present invention is illustrated in FIG. 5. A plurality of P type regions (26, 28, 36, 38, 40, 42, 48, 50, 54, 56, 62, 72) are formed on the surface of an N type substrate 22, by means well known to those skilled in the art. A second plurality of N type regions (30, 32, 34, 58, 64, 70) are further formed within a number of the first plurality of P type regions by means well known to those skilled in the art. A vertical NPN transistor structure is thereby comprised of N+ region 58 as the emitter $E_V$, P− region 56 as the base $B_V$ and the substrate 22 as the collector $C_V$. A lateral NPN transistor structure is comprised of N+ region 32 as the emitter electrode $E_L$, P− region 28 as the base electrode $B_L$, and N+ regions 30,34 as the collector electrode $C_L$.

It will be recognized that the type of integrated circuit structure illustrated in FIG. 5 is a CMOS-compatible structure wherein PMOS and NMOS transistors are available for use in complementary symmetry circuits. In particular, the source and drain electrodes $S_P$, $D_P$ of a PMOS transistor are formed on the surface of the substrate 22 by respective P+ regions 42 and 48. The gate electrode $G_P$ is formed by metallization 44 over an insulating layer 46. The source and drain electrodes $S_N$, $D_N$ of an NMOS transistor are formed on the surface of P− well 72 by respective N+ regions 64 and 70. The gate electrode $G_N$ is formed by metallization 66 over an insulating layer 68.

Referring back to FIG. 1, a bias current as determined by impedance 12 (which may for example be a resistor) flows through diode-connected transistor Q20. Transistor Q20 is the master path of a current mirror having a plurality of slave paths. Each of the plural slave paths of the current mirror through the respective source-to-drain channels of Q17, Q18, and Q19, will source a respective output current that is a substantially constant multiple of the input current through Q20, as determined by the ratio of the respective relative sizes of Q17, Q18 and Q19 to Q20. If Q17, Q18, and Q19 each have a channel width-to-length ratio equal to that of Q20, then each will act as a current source providing a current substantially equal to the channel current through Q20.

Transistors Q15 and Q16 are a pair of PMOS transistors having matched transfer characteristics which essentially track each other over process and temperature variations. Transistors Q15 and Q16 are connected in differential amplifier configuration forming a differential input stage, responsive to the potential difference between input terminals 14 and 16 to divide the current from Q17 ($i_1$) into two portions, $i_2$ and $i_3$, differentially varied according the potential between the gates of Q15 and Q16. The differential varying currents $i_2,i_3$ are received by a balanced-to-single ended converter means comprising transistors Q1, Q2, Q3, and Q10 to provide a single ended output current $i_5$. A balanced-to-single ended converter here is a current mirror amplifier which receives one of the balanced differential currents ($i_2$) through the master path thereof and the other of the balanced differential currents ($i_3$) through the slave path thereof the master path being the collector-to-emitter path of Q1 and the slave path being the collector-to-emitter path of Q2. The collector-emitter path of the current mirror amplifier transistor Q1 accepts all of $i_2$, except for small base current error, $i_4$. The collector-emitter path of the current mirror amplifier through Q2 therefore demands $i_2$ also, assuming the base-emitter junction areas of Q1 and Q2 are essentially equal since they have the same emitter-to-base voltage. The output current $i_5$ is therefore equal to the difference between $i_3$ and the current demanded by Q2 (which equals $i_2$) so that $i_5$ equals $i_3 - i_2$.

The base current required by Q1 and Q2, as well as the current flowing through diode-connection transistor Q3, is supplied via emitter follower Q10. The purpose of vertical transistor Q10 is to reduce the base current error of the bipolar mirror Q1, Q2, Q3 by the beta of that transistor so that $i_4$ is small compared to $i_2$.

Current $i_5$ output from the differential input stage flows through an intermediate amplification stage comprising transistor Q11, Q4, Q5 and current source Q18. Transistors Q4 and Q5 are arranged as a conventional current mirror amplifier with Q4 being a diode-connected master path thereof and Q5 being an output slave path thereof. Vertical transistor Q11 provides high beta for signal amplification. The voltage output at the collector of Q5 is fed back to the input at the base of Q11 via compensation capacitor C which may be integrated on the same substrate with the amplifier. The value of capacitor C determines the dominant small signal frequency response for the amplifier. Particularly, the open loop unity gain frequency (which is also the gain-bandwith product for the amplifier under closed loop conditions) is determined by appropriate choice of value for C.

In this embodiment, the output signal from the collector electrode of Q5 is connected to an output stage comprising transistor Q12, current source Q19, and current mirror amplifier Q13, Q14. The current provided by slave path Q19 is inverted in current mirror amplifier Q13, Q14 for providing a dc pull-down (idling current) of the output at the emitter of Q12. Alternate output stages for the amplifier of FIG. 1 are shown in FIGS. 2, 3, and 4. Transistor Q13 is represented in FIGS. 2, 3, and 4 as a substantially constant current source. In FIG. 2, a lateral transistor Q6 provides an uncommitted collector output at terminal 10. In FIG. 3, a pair of vertical transistors Q12,Q22 are arranged in a Darlington amplifier configuration to provide beta multiplication. In FIG. 4, the output stage is somewhat modified using an NMOS transistor Q12′ in lieu of the bipolar transistor Q12. The high imput impedance of Q12' reduces the loading effect on the output of the previous amplifier stage (from the collector of Q5).

A comprehensive analysis of operational amplifier construction and operations including thermal considerations, slew rates and frequency analysis, as well as second order effects regarding the operation of amplifier circuits of the type presented here may be found in an article by J. E. Solomon, published December 1974 in the IEEE Journal of Solid State Circuits, Volume SC9, No. 6, entitled "The Monolithic Op-Amp: a Tutorial Study."

A particular feature of the amplifier in FIG. 1 is the balance achieved by appropriate configuration of transistor Q3. As mentioned above, a current through the collector-emitter path of Q1 is $i_2$ minus the small base current error $i_4$ through Q10. Similarly, the current through the collector-emitter path Q2 is $i_3$ minus the small base current $i_5$ through Q11. Under balanced conditions, $i_2$ will more nearly equal $i_3$ if the small base currents $i_4$ and $i_5$ withdrawn by transistors Q10 and Q11 respectively, are also equal to each other. To this end, the size of transistor Q3 is chosen so that $i_4$ and $i_5$ tend to be equal, which improves the quiescent dc balance provided by current mirror amplifier pair Q1, Q2.

For example, assume that $i_1$ and $i_6$ from constant current sources Q17 and Q18 respectively are each 200 microamperes. At quiescent dc balance, $i_2$ and $i_3$ are therefore 100 microamperes each. Further, assume that the size of transistor Q5 is four times that of Q4, that Q1 and Q2 are each two times the size of Q4, and that Q3 is equal in size to Q4 as indicated in FIG. 1.

The emitter current of Q11 is the collector current of Q4 (plus the small respective base currents of Q4 and Q5). Since the emitter-base junction area of Q4 is about one fourth that of Q5, Q4 will draw about one fourth as much collector current as Q5 for the same base-emitter voltage. Therefore, the emitter current of Q11 is essentially $\frac{1}{4} \times 200$, or 50 microamperes.

The emitter current of Q10 is the collector current drawn by Q3 (plus the small respective base currents of Q1, Q2, and Q3). Since Q3 draws essentially one-half the collector current of Q1, then Q10 emitter current is essentially $\frac{1}{2} \times 100$, or 50 microamperes. The emitter currents, and hence the base currents, of Q10 and Q11 are therefore essentially equal.

Note that generally the base electrode of transistor Q3 need not be connected to its collector but can be alternatively connected to a source of bias potential of a magnitude so that Q3 draws sufficient collector current to balance the quiescent dc collector-emitter currents drawn by Q1 and Q2 respectively. However, the connection of the base electrode of Q3 to the base electrode interconnection of Q1 and Q2 is the preferred embodiment, not only because of its convenience, but because the small base current errors of Q1–Q5 also tend to contribute equally to the respective emitter currents of Q10 and Q11. In particular, the emitter current of Q11 includes $5i_b$ where $i_b$ is the base current of Q4 and $4i_b$ is the base current of Q5. By inspection, the emitter current of Q10 also includes $5i_b$, because the base current of Q1 and Q2 is substantially $2i_b$ each and the base current of Q3 is substantially $i_b$.

As previously described in connection with FIG. 5, a CMOS-type of structure is used with the present invention to form vertical and lateral transistors. Further, conventional CMOS guard band techniques are used to isolate the different types of transistors from each other.

A PMOS device in FIG. 5, for example, is guarded by P− well 40,40a which is connected to the V− potential, and forms a reversed bias diode with respect to the substrate 22 which is connected to V+. Similarly, an NMOS device is guarded by P+ band 62,62a which is connected to V− potential, and which forms a reversed bias diode with respect to N+ region 60, which is held at V+ substrate potential. The vertical transistor in FIG. 5 is similarly isolated by a reverse bias diode formed by P+ band 54,54a and substrate N+ region, 52,60. The lateral transistor contained in P− well 28 is isolated by reversed bias diode formed by bands 26,26a and the substrate region 24a,24b.

The lateral transistor contained in P− well 28 is further formed with a P+ region 36 directly below the emitter region 32 thereof for the purpose of reducing the effect of an undesirable parasitic transistor. The unwanted parasitic transistor is a vertical device formed by emitter region 32, base region 28, and the substrate 22 as a collector region. When forward-bias potential is applied between electrodes $B_L$ and $E_L$, transistor action in such vertical parasitic transistor tends to produce current flow in a vertical direction from the substrate 22 to the emitter region 32 which undesirably increases circuit power dissipation. The P+ region 36, being more heavily doped than the P− base region 28, reduces the injection efficiency of the emitter-base junction formed by respective regions 32 and 28 in the vertical plane. The effect of such P+ region 36 is to reduce the beta of the vertical parasitic transistor so that the parasitic current drain is thereby reduced. The beta of the lateral transistor, however, is not adversely affected because region 36 does not extend to the lateral sides of emitter region 32. It is noted that an N− region may also be used in lieu of P+ region 32, which also is reasoned to have a similar effect of reducing the injection efficiency of the emitter-base junction for the vertical parasitic transistor.

What is claimed is:

1. In a semiconductor structure having a unitary body of semiconductive material of a first conductivity type, a first plurality of semiconductor regions of a second conductivity type disposed in PN junction forming relation with said semiconductor body, a second plurality of semiconductor regions of the first conductivity type disposed in PN junction forming relation with a number of said plurality of semiconductor regions on the surface thereof remote from said semiconductor body, said first and second plurality of semiconductor regions forming substructures operable as field-effect transistors, forming substructures operable as vertical bipolar transistors of the second conductivity type wherein said semiconductor body serves as the collector region thereof, and forming substructures operable as lateral bipolar transistors of the second conductivity type, an amplifier comprising:

first and second terminals for receiving an operating potential therebetween, said first terminal being connected to said semiconductor body;

a third terminal for receiving an input signal;

a fourth terminal for providing output signal;

a vertical bipolar transistor having respective emitter, base, and collector electrodes, the base electrode of said vertical bipolar transistor being connected to said third terminal; and a lateral bipolar transistor having respective emitter, base and collector electrodes, the base electrode of said lateral bipolar transistor being connected to the emitter electrode of said vertical bipolar transistor, the emitter electrode of said lateral bipolar transistor being connected to said second terminal, the collector electrode of said lateral transistor being connected to said fourth terminal.

2. In a semiconductor structure having a unitary body of semiconductive material of a first conductivity type, a first plurality of semiconductor regions of a second conductivity type disposed in PN junction forming relation with said semiconductor body, a second plurality of semiconductor regions of the first conductivity type disposed in PN junction forming relation with a number of said first plurality of semiconductor regions on the surface thereof remote from said semiconductor body, said first and second plurality of semiconductor regions forming substructures operable as field effect transistors having a channel of the second conductivity type, forming substructures operable as vertical bipolar transistors of the second conductivity type wherein said semiconductor body serves as the collector region thereof, and forming substructures operable as lateral bipolar transistors of the second conductivity type, an amplifier comprising:

a field effect transistor having respective gate, drain and source electrodes;

a vertical bipolar transistor having respective emitter, base and collector electrodes, the base electrode of said vertical bipolar transistor being connected to the drain electrode of said field effect transistor;

a lateral bipolar transistor having respective emitter, base, and collector electrodes, the base electrode of said lateral transistor being connected to the emitter electrode of said vertical transistor;

first and second terminals for receiving an operating potential therebetween said first terminal being connected to said semiconductor body, the source electrode of said field effect transistor being connected to said first terminal, the emitter electrode of said lateral transistor being connected to said second terminal;

a third terminal for receiving an input signal to which the gate electrode of said field effect transistor is connected; and a fourth terminal for providing output signal to which the collector electrode of said lateral bipolar transistor is connected.

3. An amplifier according to claim 2 further comprising:

a second lateral transistor having respective emitter, base, and collector electrodes, the respective base and emitter electrodes of said second lateral transistor being connected to the respective base and emitter electrodes of said first lateral transistor, the collector of said second lateral transistor being connected to the base electrode of said vertical transistor.

4. An amplifier according to claim 2 or 3 further comprising:

a third lateral transistor having respective emitter, base, and collector electrodes, said third lateral transistor having an interconnection between base and collector electrodes thereof, said interconnection being directly connected to the base electrode of said first lateral transistor, the emitter electrode of said third lateral transistor being connected to the emitter electrode of said first lateral transistor.

5. In a semiconductor structure having a unitary body of semiconductive material of a first conductivity type, a first plurality of semiconductor regions of a second conductivity type disposed in PN junction forming relation with said semiconductor body, a second plurality of semiconductor regions of the first conductivity type disposed in PN junction forming relation with a number of said first plurality of semiconductor regions on the surface thereof remote from said semiconductor body, said first and second plurality of semiconductor regions forming substructures operable as field effect transistors, forming substructures operable as vertical bipolar transistors of the second conductivity type wherein said semiconductor body serves as the collector region thereof, and forming substructures operable as lateral bipolar transistors of the second conductivity type an amplifier comprising:

first and second terminals for receiving an operating potential therebetween, said first terminal being connected to said semiconductor body;

a third terminal for receiving an input signal;

a fourth terminal for providing output signal;

a vertical bipolar transistor having respective emitter, base, and collector electrodes, the base electrode of said vertical bipolar transistor being connected to said third terminal;

first and second lateral bipolar transistors having respective emitter, base, and collector electrodes; and means connecting said first and second lateral bipolar transistors for operation as a current mirror amplifier having an input node, an output node, and a common node, said input node connected to the emitter electrode of said vertical bipolar transistor, said common node connected to said second terminal, and said output node connected to said fourth terminal.

6. An amplifier according to claim 5 wherein said means connecting said first and second lateral bipolar transistors for operation as a current mirror amplifier comprises:

a connection from the collector electrode of said first lateral bipolar transistor to the emitter electrode of said vertical bipolar transistor;

a connection between the respective emitter electrodes of said first and second lateral bipolar transistors to said second terminal;

a connection from the collector electrode of said second lateral bipolar transistor to said third terminal; and means connecting the base electrode of said first lateral bipolar transistor to the collector electrode thereof for conditioning said first lateral bipolar transistor to operate as a current-to-voltage converter responsive to an input current supplied between said first and second terminals.

7. An amplifier according to claim 6 wherein said means connecting the base electrode of said first lateral bipolar transistor to the collector electrode thereof is a direct connection without substantial intervening impedance.

8. In a semiconductor structure having a unitary body of a semiconductive material of a first conductivity type, a first plurality of semiconductor regions of a second conductivity type disposed in PN junction forming relation with said semiconductor body, a second plurality of semiconductor regions of the first conductivity type disposed in PN junction forming relation with a number of said first plurality of semiconductor regions on the surface thereof remote from said semiconductor body, said first and second plurality of semiconductor regions forming substructures operable as field effect transistors having a channel of the second conductivity type, forming substructures operable as vertical bipolar transistors of the second conductivity type wherein said semiconductor body serves as the collector region thereof, and forming substructures operable as lateral bipolar transistors of the second conductivity type, an amplifier comprising:

first and second terminals for receiving an operating potential therebetween, said first terminal being connected to said semiconductor body;

third and fourth terminals for receiving an input signal therebetween;

current supply means connected to said first terminal for supplying a substantially constant current to a first circuit node;

first and second field effect transistors having respective gate, drain, and source electrodes;

means connecting said first and second field effect transistors as a differential amplifier, connected to said first circuit node and responsive to said input signal between said third and fourth terminals for providing differential signal currents at respective second and third circuit nodes;

first and second lateral bipolar transistors having respective emitter, base, and collector electrodes; and means connecting said first and second lateral bipolar transistors as a balanced-to-single-ended converter, connected to said second terminal and responsive to the respective differential signal currents at said second and third circuit nodes respectively, for providing a single-ended output signal at said third circuit node, which means includes a vertical bipolar transistor having base and emitter electrodes coupled between said second circuit node and said first lateral bipolar transistor.

9. An amplifier according to claim 8 wherein said means connecting said first and second field effect transistors as a differential amplifier comprises:

a connection between the respective source electrodes of said first and second field effect transistors to said first circuit node;

a respective connection from each said third and fourth terminal to the respective gate electrode of said first and second field effect transistors;

a respective connection from each drain electrode of said first and second field effect transistors to said second and third circuit nodes respectively.

10. An amplifier according to claim 8 wherein said means connecting said first and second lateral bipolar transistors as a balanced-to-single-ended converter comprises:

a connection from the collector electrode of said first lateral bipolar transistor to said second circuit node;

means for connecting the respective emitter electrodes of said first and second lateral bipolar transistors to said second terminal;

a connection from the collector electrode of said second lateral bipolar transistor to said third circuit node;

means including said vertical bipolar transistor connecting the base electrode of said first lateral bipolar transistor to said second circuit node for conditioning said first lateral bipolar transistor to operate as a current-to-voltage converter responsive to an input current supplied between said first and second terminals.

11. An amplifier according to claim 10 wherein said means connecting the base electrode of said first lateral bipolar transistor to to said second circuit node includes respective means for connecting the base electrode of said vertical bipolar transistor to the collector electode of said first lateral bipolar transistor and for connecting the emitter electrode of said vertical bipolar transistor to the base electrode of said first lateral bipolar transistor.

* * * * *